(12) United States Patent
Bieri et al.

(10) Patent No.: US 7,372,267 B2
(45) Date of Patent: May 13, 2008

(54) METHOD AND APPARATUS FOR GENERATION OF MAGNETIZATION TRANSFER CONTRAST IN STEADY STATE FREE PRECESSION MAGNETIC RESONANCE IMAGING

(75) Inventors: Oliver Bieri, Basel (CH); Klaus Scheffler, Basel (CH)

(73) Assignee: University of Basel, Basel (CH)

( * ) Notice: Subject to any disclaimer, the term of this patent is extended or adjusted under 35 U.S.C. 154(b) by 0 days.

(21) Appl. No.: 11/418,476

(22) Filed: May 4, 2006

(65) Prior Publication Data

US 2007/0257672 A1 Nov. 8, 2007

(51) Int. Cl.
*G01V 3/00* (2006.01)
(52) U.S. Cl. .................... 324/307; 324/309
(58) Field of Classification Search ......... 324/300–322
See application file for complete search history.

(56) References Cited

U.S. PATENT DOCUMENTS

| | | | |
|---|---|---|---|
| 5,050,609 A | | 9/1991 | Balaban et al. |
| 6,219,571 B1 * | | 4/2001 | Hargreaves et al. ........ 600/410 |
| 6,239,597 B1 * | | 5/2001 | McKinnon .................. 324/307 |
| 6,984,981 B2 * | | 1/2006 | Tamez-Pena et al. ....... 324/309 |
| 2006/0020197 A1 * | | 1/2006 | Gupta et al. ................ 600/410 |

OTHER PUBLICATIONS

Graham, S.J., et al. "Analysis of Changes in MR Properties of Tissues After Heat Treatment." *Magnetic Resonance in Medicine*, vol. 2, Issue 6 (1999): 1061-1071; Wiley-Liss, Inc.
Stanisz, J.G., et al. "Characterizing White Matter with Magnetization and $T_2$." *Magnetic Resonance in Medicine*, vol. 42, Issue 6 (1999): 1128-1136. Wiley-Liss, Inc.
Sled, John G., et al. "Quantitative Imaging of Magnetization Transfer Exchange and Relaxation Properties in Vivo Using MRI." *Magnetic Resonance in Medicine*, vol. 46, Issue 5 (2001):923-931. Wiley-Liss, Inc.
Stanisz, Greg J., et al. "$T_1$, $T_2$ Relaxation and Magnetization Transfer in Tissue at 3T." *Magnetic Resonance in Medicine*, vol. 54, Issue 3 (2005): 507-512. Wiley-Liss, Inc.

* cited by examiner

*Primary Examiner*—Brij B. Shrivastav
(74) *Attorney, Agent, or Firm*—Joyce von Natzmer; Pequignot + Myers LLC

(57) ABSTRACT

Apparatus and methods of generating magnetization transfer contrast images in which signal to noise ratios are improved and/or in which image acquisition times are reduced. In certain embodiments, apparatus and methods which utilize sensitivity and/or non-sensitivity to magnetization transfer effects to improve the contrast of images which are generated. In certain additional embodiments, apparatus and methods for generating magnetization transfer contrast images which exhibit sensitivity to longitudinal and transverse relaxation times of bound and free proton pools, respectively.

20 Claims, 6 Drawing Sheets

METHOD AND APPARATUS FOR GENERATION OF MAGNETIZATION TRANSFER CONTRAST IN STEADY STATE FREE PRECESSION MAGNETIC RESONANCE IMAGING

FIELD OF INVENTION

This invention relates to apparatus and steady state methods in which transfer of magnetization between free and bound protons is used to enhance the contrast between different types of tissues and fluids in a specimen. Through this invention, signal-to-noise ratios are improved and/or image acquisition times are reduced. In certain embodiments, the unique magnetization transfer contrast imaging techniques, and apparatus therefore, utilize sensitivity and/or non-sensitivity to magnetization transfer effects, and combinations thereof, to improve the contrast of images which are generated. In certain additional embodiments, this invention relates to apparatus and methods for generating magnetization transfer contrast images which exhibit sensitivity to longitudinal and transverse relaxation times of bound and free proton pools, respectively.

BACKGROUND OF THE INVENTION

Since its introduction in 1977 as an alternative (or as supplementation) to invasive surgical procedures and/or x-rays, the utilization of magnetic resonance imaging (hereinafter "MRI") in medical diagnosis and treatment has increased dramatically. In this regard, modem MRI imaging techniques produce images with exceptional contrast and which can be rendered in any plane as well as three-dimensionally. Moreover, apart from their imaging quality, MRI imaging techniques are believed to be very safe. For example, MRI techniques do not utilize harmful ionizing radiation but instead rely on the application of magnetic fields and radio frequencies which induce atomic level energy changes which are detectable for assimilation into highly detailed, accurate body (or other object type) images. In contrast, imaging techniques such as computerised tomography scanning (CT scanning) expose patients to significant doses of ionizing radiation which is believed to increase incidences of malignancy. Furthermore, CT techniques cannot reproduce the relative high contrast of an MRI image and have the additional shortcoming of not being able to adequately differentiate between similar but otherwise distinct tissue types (e.g., in particular, if the tissues have similar densities).

Although, conventional MRI has proven to be a dramatic leap forward in the medical arts, MRI is somewhat limited by long image acquisition times and low signal-to-noise ratios (SNR), difficulties in certain spatial resolutions, and in differentiating between lipid based and water based tissues. Although modem, specialized MRI techniques, such as steady state free precession (SSFP), ameliorate, at least to a degree, such issues, such techniques exhibit greater than desired signal loss as a result of the transfer of magnetization between free and bound protons in tissues (henceforth called magnetization transfer ot MT), for example. This, as a result, limits the techniques usefulness in certain clinical applications such as, for example, in the imaging of the brain for evaluation of white matter type diseases such as multiple sclerosis.

In view of the above, it is apparent that there exists a need in the art for imaging methods and/or apparatus which solve or at least ameliorate one or more of the above drawbacks of the prior art. It is a purpose of this invention to fulfill this need in the art as well as other needs which will become more apparent to the skilled artisan once given the following disclosure.

SUMMARY OF THE INVENTION

Generally speaking, this invention fulfills the above described needs in the art by providing:

a method of magnetic resonance imaging comprising the steps of:

acquiring a first steady state magnetic resonance image generated from high weighted magnetic transfer;

acquiring a second steady state magnetic resonance image generated from low weighted magnetic transfer; and combining the first and the second magnetic resonance images to obtain a magnetization transfer contrast image.

In certain embodiments, the inventive methods are capable of generating two-dimensional images, three-dimensional images, or images which are combinations of two and three-dimensional images.

In alternative embodiments, this invention provides:

an apparatus for steady state magnetic resonance imaging comprising:

a magnet for generating a magentic field about an object to be imaged;

at least one pulse generator capable of inducing a high saturation of bound protons and capable of inducing a low saturation of macromolecular protons;

an image aquisition mechanism capable of acquiring a first steady state magnetic resonance image generated from high weighted magnetic transfer and capable of acquiring a second steady state magnetic resonance image generated from low weighted magnetic transfer; and a computer embodying program code, the computer being capable of combining said first magnetic resonance image with said second magnetic resonance image to obtain a magnetization transfer contrast image.

In certain embodiments, the inventive appartus are capable of generating two-dimensional images, three-dimensional images, or images which are combinations of two and three-dimensional images.

In certain embodiments, this invention provides apparatus and methods for acquiring magnetic resonance images with improved image contrast.

In other embodiments, this invention provides apparatus and methods for acquiring magnetic resonance images in reduced image acquisition times.

In certain preferred embodiments, this invention provides apparatus and methods which are adept for use in diagnosis and/or treatment of white matter diseases such as multiple sclerosis or in the diagnoses of infarcted tissue of the heart. In at least one such preferred embodiment, this invention provides methods and apparatus which exhibit improved medical diagnoses and treatment capabilities due, in part, to increased sensitivities to relaxation parameters such as transverse relaxation times and longitudinal relaxation (e.g., of the free and bound proton pools).

DETAILED DESCRIPTION OF CERTAIN EMBODIMENTS

For a more complete understanding of the present invention and advantages thereof, references is now made to the following description of various illustrative and non-limiting embodiments thereof, taken in conjunction with the accompanying drawings in which like reference numbers indicate like features.

As briefly discussed in the BACKGROUND section herein, magnetic resonance imaging, hereinafter "MRI" (and more generically referred to as nuclear magnetic resonance imaging or "NMR"), is a method of generating images which utilizes the detection of the relaxation properties of excited atomic nuclei. More particularly, MRI uses the application of magnetic fields to align atomic nuclei then exposes the nuclei to pulses of electromagnetic energy (radio frequency or "RF" pulses) in order to force the nuclei to temporarily assume non-aligned, higher energy states. In such methodologies, changes in energy states, as they are effected by the application of magnetic and RF fields, are measured and/or detected and then assimilated into images.

Figure 1:
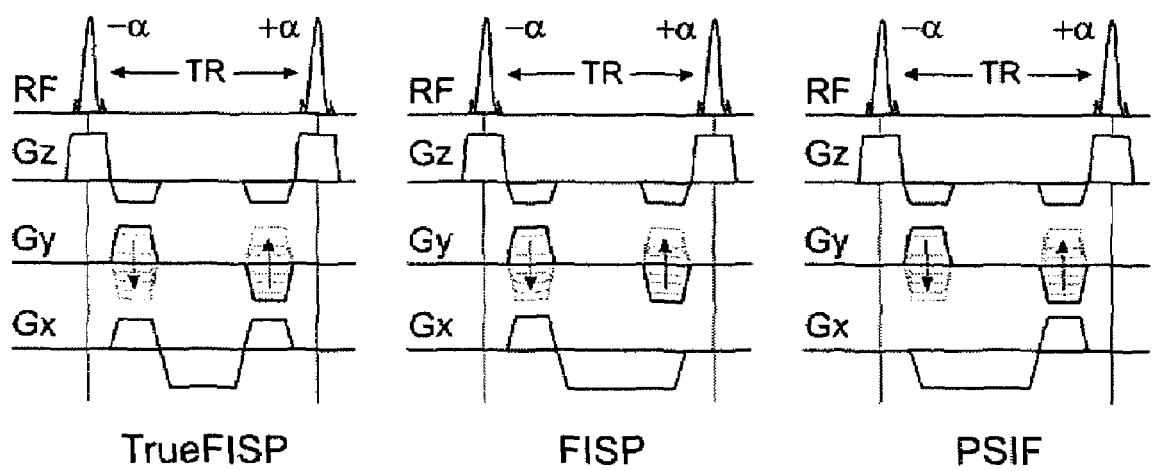
FIG. 1 digrammatically illustrates a prior art steady state free precession sequence scheme.

Although images produced by known MRI techniques are adequate in many applications, improvements in both image contrast (or resolution) and image acquisition times are desired. FIG. 1, in this regard, illustrates one example of a prior art SSFP sequence scheme used for MRI image acquisition which exhibits the aforementioned drawbacks.

Addressing such needs in the art, it has been discovered that by integrating images assimilated by MT weighted and non-MT-weighted MRI imaging techniques, deficiencies in imaging quality and acquisition time can be ameliorated by exploiting the strengths or benefits (e.g., sensitivities) of each technique or method to result in a final, high contrast MTC image.

Figure 2A:
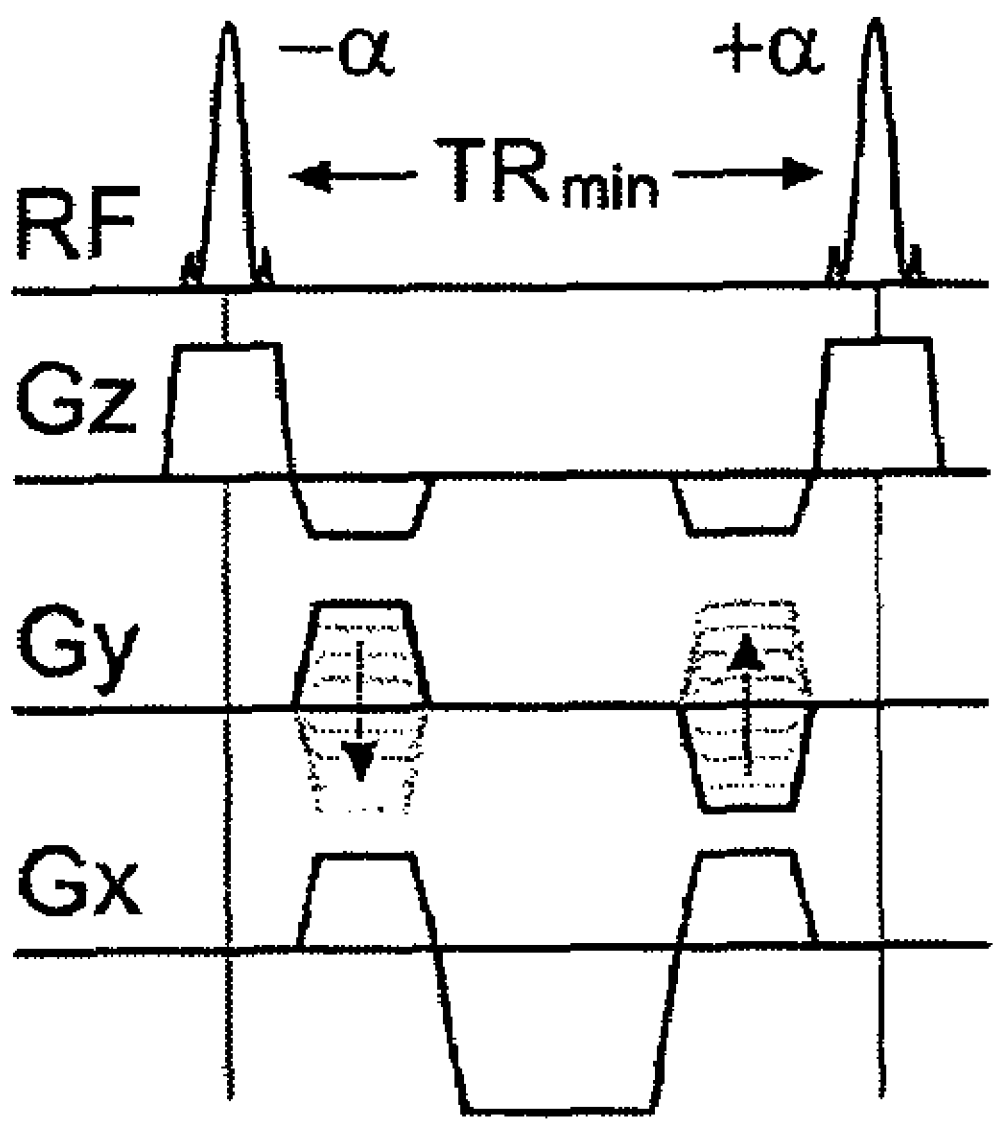
FIG. 2A digrammatically illustrates one embodiment of a methodology for generating a high weighted magnetization transfer image according to the subject invention.
Figure 2B:
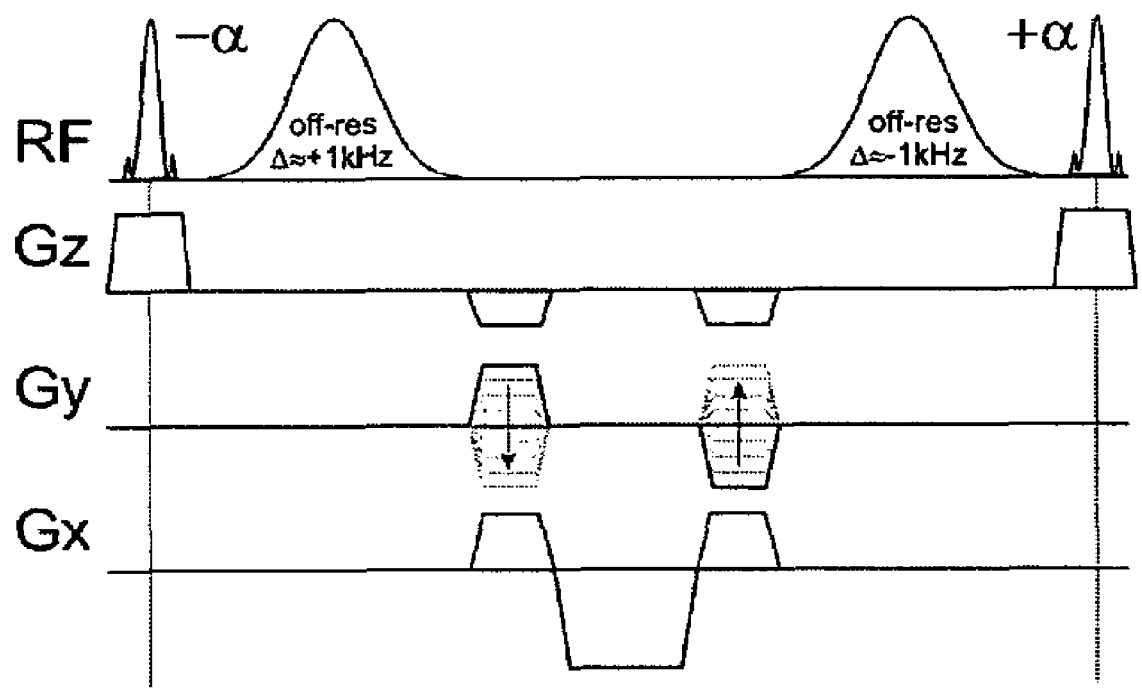
FIG. 2B diagrammatically illustrates one embodiment of a methodology for generationg a heavy weighted magnetization transfer image as an alternative to the methodology depicted in FIG. 2A.

Referring now to FIGS. 2A and 2B alternate embodiments of methods by which MT weighted images can be obtained are diagrammatically illustrated therein (e.g., to be combined with very low or reduced MT-weighted images to produce final high quality MTC images as will be described in detail below). Specifically, FIG. 2A illustrates a method of generating a heavily (or high) weighted MT image with balanced SSFP (bSSFP) by inducing a strong saturation of the bound protons in the area being imaged. Saturation may be achieved in a number of ways, but as illustrated is accomplished by applying an RF pulse scheme with small or minimal TR (i.e., time between pulse repetition). Alternatively, such as depicted in FIG. 2B, multiple off-resonance pulse trains (e.g., without shortened TR) can be applied to acheive the same desired saturation. In each method, an MT-weighted image can be acquired for use in developing a final, "combined" high-quality MTC image.

Figure 3A:
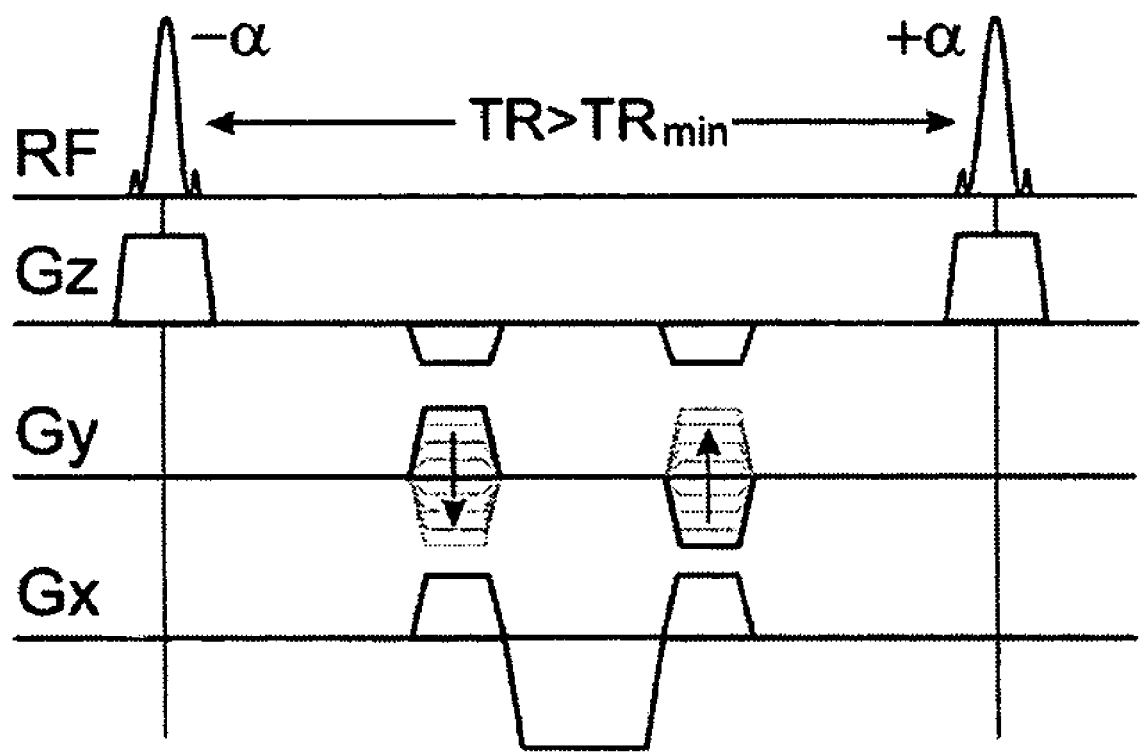
FIG. 3A diagrammatically illustrates one embodiment of a methodology for inducing very low or reduced magnetization transfer effects using long repeition times, igenerated through a low RF pulse rate, in combination with short RF pulse lengths, or a high bandwidth.
Figure 3B:
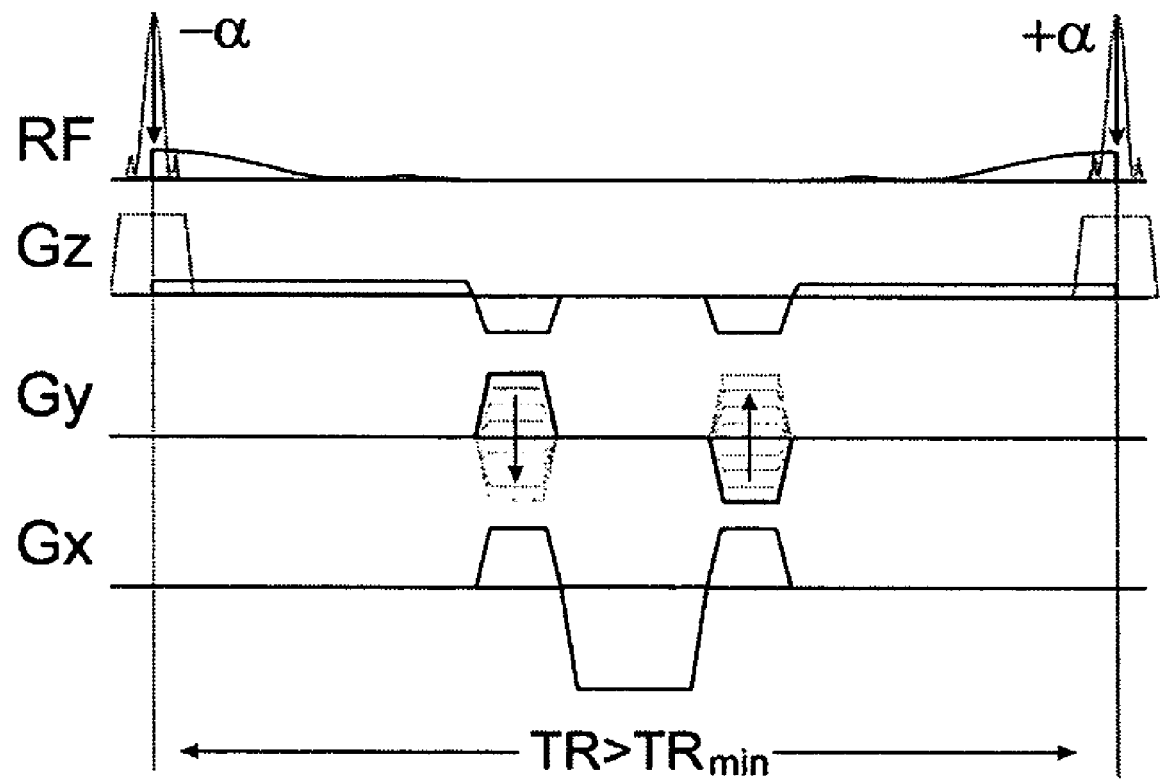
FIG. 3B diagrammatically illustrates one embodiment of a methodology for inducing very low or reduced magnetization transfer effects using long repetition times, generated via low RF pulse rates, in combination with long RF pulse lengths, or a high bandwidth.

Referencing now FIG. 3, an example method for generation of a very low or reduced MT-weighted image (e.g., an SSFP image with strongly suppressed MT effects) for use in the subject invention is illustrated therein (e.g., by suppressing saturation of the macromolecular protons). Specifically, this suppressed saturation may be achieved and a resulting image generated in several ways. For example, an SSFP sequence with a increased repetition time (TR), as displayed in FIG. 3A, can be employed. Alternatively, a lengthened RF pulse may be applied, as displayed in FIG. 3B. Alternatively, a lengthened RF pulse may be applied in combination with an increased reptition time.

Figure 4:
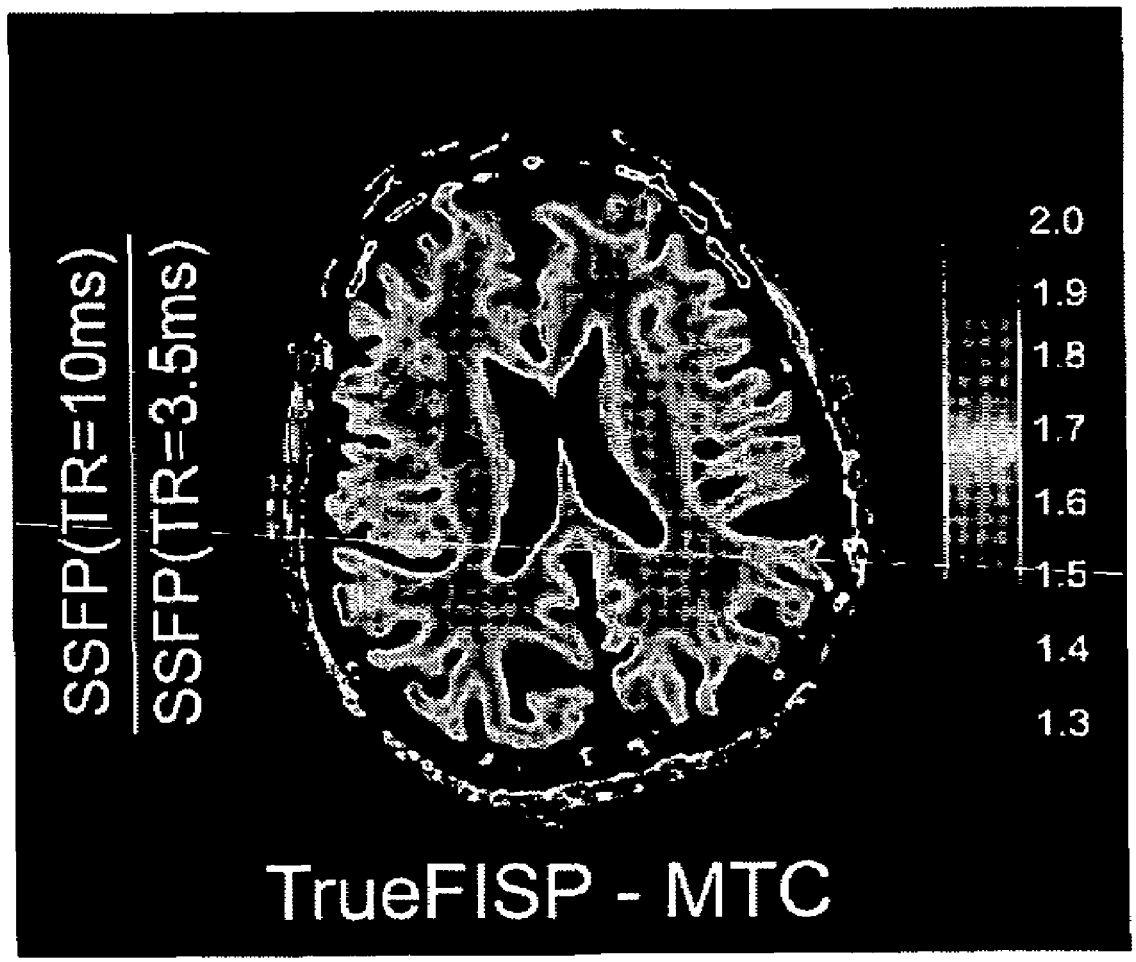
FIG. 4 illustrates a magnetic transfer contrast/balanced steady state free precession (MTC-bSSFP) image obtained utilizing a method of MRI image acquisition according to one embodiment of the subject invention.

Turning now to FIG. 4, this figure depicts an image which was generated by mathematically comparing and combining MT-weighted and non-MT-weighted images (e.g., generated by the techniques above) utilizing an experimentally proven embodiment of the inventive methodology. In this regard, the image depicted in FIG. 4 was generated by comparing and combining data from two images, one generated with induced high or heavy weighted magnetic transfer, and the second generated with induced low weighted magnetic transfer (e.g., by suppressed saturation). Specifically, the image illustrated in FIG. 4 was created by combining a first image obtained by inducing high saturation in the bound proton pool of the area being imaged with a second image obtained by suppressing saturation of the macromolecular protons in the same area. Although the various states of proton pool saturation (e.g., heavily saturated or suppressed saturation) can be achieved employing the techniques described with respect to FIGS. 2A, 2B, and 3 above (e.g. utilizing variances in TR or pulse length), respectively, other mechanisms or methods which achieve such results are, of course, contemplated.

Solving or ameliorating one or more deficiciencies in the prior art by utilizing the unique MRI methodologies described above which assemble combinations of MT suppressed and heavily weighted MT images, improved image acquisition times (e.g., reduced acquisition times) and high contrast images are obtained. Specifically, high signal to noise ratios are possible thus resulting in improved image contrast when compared to images obtained by conventional gradient echo (GRE) MRI protocols.

Employing the unique MRI imaging methods which are described above results in images which display improved contrast due to their sensitivities to relaxation parameters to which standard MTC methods are relatively insensitive. Thus, certain embodiments of the invention described herein reduce or eliminate the inherent trade-off between image quality and detection sensitivity as displayed in prior art which, in turn, demonstrates potential for certain specialized medical uses. For example, several diseases are associated with changes in relaxation properties. In particular, white matter diseases such as multiple sclerosis, Wallerian degeneration, ischema, optic Neuritis, and amyotrophic lateral sclerosis may trigger a change in relaxation properties, and it is hypothesized that these conditions may be observed utilizing embodiments of this invention. The preferred embodiments of the invention may prove especially useful in the treatment of multiple sclerosis, as it may allow physicians to assess the efficacy of various multiple sclerosis treatments as well as view degeneration over time. Furthermore, the preferred embodiments of the invention may prove especially useful in the diagnosis of infarcted tissue of the myocardium or other diseases of the heart.

Moreover, although prior art MRI techniques allow limited 3D image resolution, certain embodiments of this invention permit the acquisition or creation of detailed of 3D image data sets. This potential may open new fields of modified MTC that allow for enhanced diagnostic and treatment capability.

Once given the above disclosure, many other features, modifications, and improvements will become apparent to the skilled artisan. Such other features, modifications, and improvements are therefore considered to be part of this invention, the scope of which is to be determined by the following claims:

We claim:

1. An apparatus for steady state magnetic resonance imaging comprising:
   a magnet for generating a magnetic field about an object to be imaged; at least one pulse generator capable of inducing a high saturation of bound protons and capable of inducing a low saturation of bound protons;
   an image aquisition mechanism capable of acquiring a first steady state magnetic resonance image generated from high weighted magnetic transfer and capable of acquiring a second steady state magnetic resonance image generated from low weighted magnetic transfer;
   and a computer embodying program code, said computer being capable of combining said first magnetic resonance image with said second magnetic resonance image to obtain a magnetization transfer contrast image.

2. An apparatus for steady state magnetic resonance imaging as described in claim 1, wherein said apparatus is capable of generating magnetization transfer contrast images of a type selected from the group consisting of: two-dimensional; three-dimensional; and a combination of two and three-dimensional.

3. An apparatus for steady state magnetic resonance imaging as described in claim 1, wherein said apparatus allows for the diagnosis of certain physiological states indicative of pathologies selected from the group consisting of: multiple sclerosis, Wallerian degeneration, ischema, optic Neuritis, amyotrophic lateral sclerosis, infarcted tissue of the myocardium, and combinations of both neurological disease and myocardial damage.

4. An apparatus for steady state magnetic resonance imaging according to claim 1 wherein said pulse generator is capable of applying at least two off-resonance RF pulses to an area of an object being imaged to obtain high saturation of bound protons.

5. An apparatus for steady state magnetic resonance imaging according to claim 1 wherein said pulse generator is capable of applying a high RF pulse rate to an area of an object being imaged to obtain high saturation of bound protons.

6. An apparatus for steady state magnetic resonance imaging according to claim 1 wherein said pulse generator is capable of applying an RF pulse with a long pulse length to obtain a low saturation of bound protons.

7. An apparatus for steady state magnetic resonance imaging according to claim 1 wherein said pulse generator is capable of applying an RF pulse at a decreased pulse rate to obtain a low saturation of bound protons.

8. A method of steady state magnetic resonance imaging comprising the steps of:
   acquiring a first steady state magnetic resonance image generated from high weighted magnetic transfer;
   acquiring a second steady state magnetic resonance image generated from low weighted magnetic transfer; and
   combining said first and said second magnetic resonance images to obtain a magnetization transfer contrast image.

9. A method of steady state magnetic resonance imaging according to claim 8, wherein said method is capable of generating magnetization transfer contrast images of a type selected from the group consisting of: two-dimensional; three-dimensional; and a combination of two and three-dimensional.

10. A method of steady state magnetic resonance imaging according to claim 8, wherein said method allows for the diagnosis of certain physiological states indicative of pathologies selected from the group consisting of: multiple sclerosis, Wallerian degeneration, ischema, optic Neuritis, amyotrophic lateral sclerosis, infarcted tissue of the myocardium, and combinations of both neurological disease and myocardial damage.

11. A method of steady state magnetic resonance imaging according to claim 8 wherein said first steady state magnetic resonance image is generated by inducing a high saturation of bound protons.

12. A method of steady state magnetic resonance imaging according to claim 11 wherein said second steady state magnetic resonance image is generated by inducing a low saturation of macromolecular protons.

13. A method of steady state magnetic resonance imaging according to claim 11 wherein said state of high saturation of macromolecular protons is achieved by applying at least two off-resonance RF pulses to an area being imaged.

14. A method of steady state magnetic resonance imaging according to claim 11 wherein said state of high saturation of macromolecular protons is achieved by increasing RF pulse rate.

15. A method of steady state magnetic resonance imaging according to claim 12 wherein said state of low saturation of macromolecular protons is achieved by increasing RF pulse length.

16. A method of steady state magnetic resonance imaging according to claim 12 wherein said state of low saturation of bound protons is achieved by decreasing RF pulse rate.

17. A method of steady state magnetic resonance imaging according to claim 11 wherein said magnetization transfer contrast image which results exhibits high contrast as a result of improved senstivity to relaxation parameters selected from the group consisting of: transverse relaxation times of the liquid proton pool and longitudinal relaxation times of the macromolecular proton pool.

18. A method of steady state magnetic resonance imaging according to claim 12 wherein said magnetization transfer contrast image which results exhibits high contrast as a result of improved senstivity to relaxation parameters selected from the group consisting of: transverse relaxation times of the liquid proton pool and longitudinal relaxation times of the macromolecular proton pool.

19. A method of steady state magnetic resonance imaging according to claim 17 wherein image acquisition times are decreased and signal to noise ratios are improved.

20. A method of steady state magnetic resonance imaging according to claim 18 wherein image acquisition times are decreased and signal to noise ratios are improved.

* * * * *